United States Patent
Yamamura (10) Patent No.: US 7,465,965 B2
(45) Date of Patent: Dec. 16, 2008

(54) TRANSISTOR CONTROLLED THYRISTOR MEMORY DEVICE

(75) Inventor: Ikuhiro Yamamura, Tokyo (JP)

(73) Assignee: Sony Corporation (JP)

( * ) Notice: Subject to any disclaimer, the term of this patent is extended or adjusted under 35 U.S.C. 154(b) by 50 days.

(21) Appl. No.: 11/512,313

(22) Filed: Aug. 30, 2006

(65) Prior Publication Data

US 2007/0051973 A1  Mar. 8, 2007

(30) Foreign Application Priority Data

Aug. 31, 2005  (JP) .............................. 2005-250615

(51) Int. Cl.
*H01L 29/74* (2006.01)
(52) U.S. Cl. ................... 257/133; 257/107; 257/146; 257/E27.014; 257/E29.17
(58) Field of Classification Search ................. 257/146, 257/133

See application file for complete search history.

(56) References Cited

U.S. PATENT DOCUMENTS

| 6,229,161 | B1 | 5/2001 | Nemati et al. | |
|---|---|---|---|---|
| 6,790,713 | B1 * | 9/2004 | Horch | 438/135 |
| 7,042,027 | B2 * | 5/2006 | Bhattacharyya | 257/146 |
| 2005/0098794 | A1 * | 5/2005 | Quek et al. | 257/133 |
| 2005/0148118 | A1 * | 7/2005 | Zheng et al. | 438/133 |
| 2006/0043411 | A1 * | 3/2006 | Bhattacharyya | 257/138 |
| 2007/0096203 | A1 * | 5/2007 | Mouli | 257/330 |

OTHER PUBLICATIONS

Fraid Nemati, et al., "A Novel Thyristor-based SRAM Cell (T-RAM) for High-Speed, Low-Voltage Giga-scale Memories", 1999, IEDM Tech, pp. 283.

* cited by examiner

*Primary Examiner*—Lex Malsawma
*Assistant Examiner*—Robert Huber
(74) *Attorney, Agent, or Firm*—Rader Fishman & Grauer PLLC; Ronald P. Kananen (57) ABSTRACT

A semiconductor device including: a bulk semiconductor substrate; an access transistor; a thruster formed on the bulk semiconductor substrate connecting to the access transistor; an element separating region to separate the region for the access transistor and the region for the thruster from each other; and a wiring layer connecting one of the diffused layers of the access transistor and the cathode of the thruster together through a connecting hole, the impurity region at the anode side of the thruster being composed of a p-type impurity region, an n-type impurity region, p-type impurity region, and an n-type impurity region, which are formed sequentially in the depth wise direction, with the lowermost n-type impurity region receiving the same voltage as that applied to the anode at the time of data holding.

2 Claims, 9 Drawing Sheets

TRANSISTOR CONTROLLED THYRISTOR MEMORY DEVICE

CROSS REFERENCES TO RELATED APPLICATIONS

The present invention contains subject matter related to Japanese Patent Application JP 2005-250615 filed with the Japanese Patent Office on Aug. 31, 2005, the entire contents of which being incorporated herein by reference.

BACKGROUND OF THE INVENTION

1. Field of the Invention

The present invention relates to a semiconductor device with a memory cell composing a transistor and a thyristor in a reduced cell area.

2. Description of the Related Art

Attempts have long been made to assemble memory from elements having negative-resistance characteristics, because the resulting memory would represent "zero" and "one" according to the two states—high resistance and low resistance—which the negative-resistance element assumes.

There has recently been proposed a new memory cell which composes a thyristor (as a negative-resistance element) and an access transistor serially connected thereto, said thyristor being controlled (for turn on and turn off) by a gate electrode formed thereon. This memory cell will be referred to as T-RAM memory cell hereinafter. See, U.S. Pat. No. 6229161 (B1) and Farid Nemati and James D. Plummer "A Novel Thyristor-based SRAM Cell (T-RAM) for High-Speed, Low-Voltage, Giga-Scale Memories" Technical Digest IEDM 1999, p. 283-286. (Hereinafter referred to as Patent Document 1 and Non-Patent Document 1)

Figure 5:
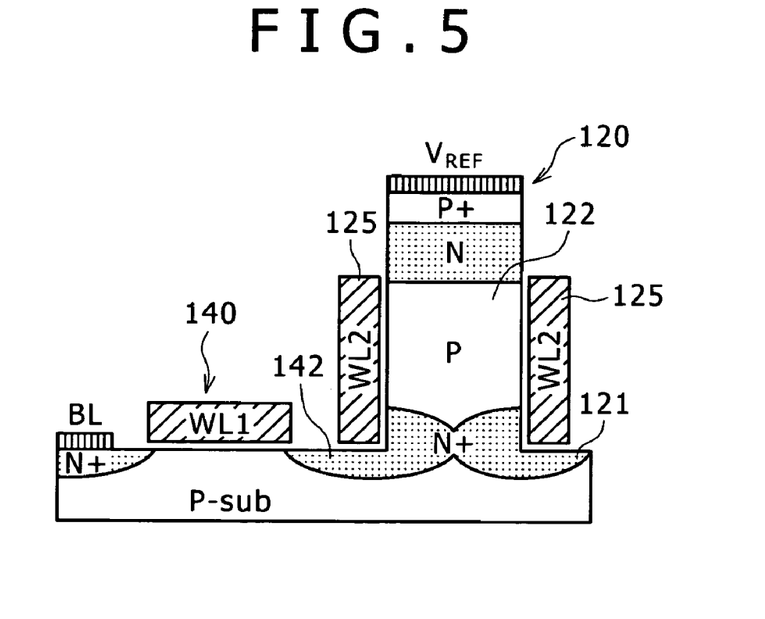
FIG. 5 is a sectional view of the T-RAM memory cell in related art mentioned in Non-Patent Document 1.

The T-RAM memory cell mentioned in Non-Patent Document 1 will be described below with reference to FIG. 5 attached hereto. In FIG. 5, there is shown a thyristor 120 which has the vertical pnpn junction. The thyristor 120 has an n-type emitter 121 connected to an n-type diffused layer 142 of an access transistor 140 and also has a gate electrode 125 which is arranged on the p-type base 122 by MIS structure.

Figure 6:
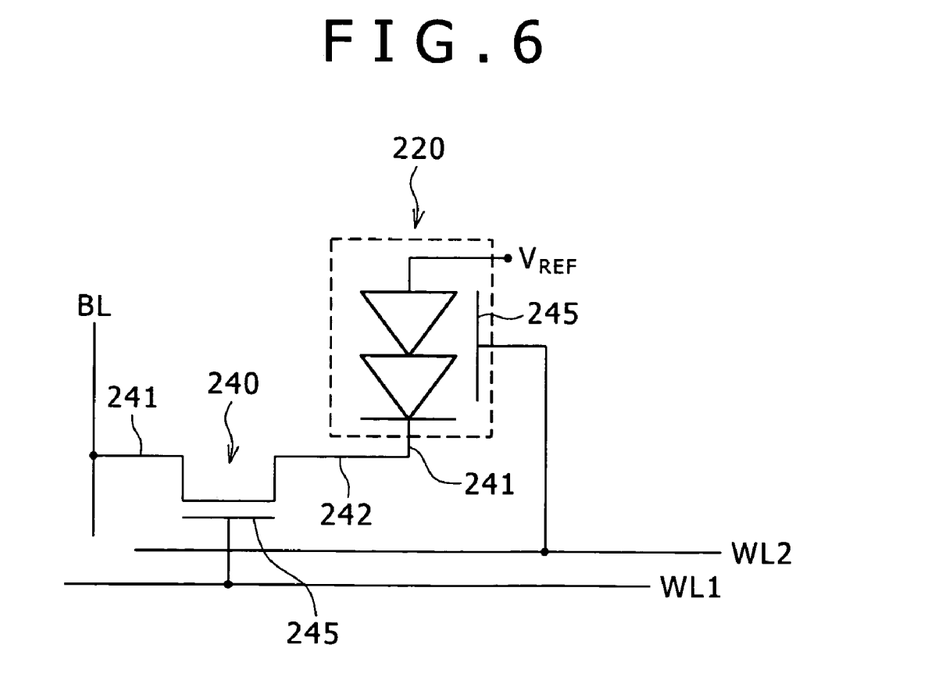
FIG. 6 is an equivalent circuit diagram of the T-RAM memory cell in related art mentioned in Non-Patent Document 1.

The T-RAM memory cell mentioned in Non-Patent Document 1 is represented by an equivalent circuit shown in FIG. 6. It is to be noted that the gate electrode 245 of the access transistor 240 is connected to the word line WL1, the gate electrode 225 of the thyristor 220 is connected to the word line WL2, one diffused layer 241 of the access transistor 240 is connected to the bit line BL, the other diffused layer 242 of the access transistor 240 is connected to the n-type emitter 221 of the thyristor 220, and the p-type emitter of the thyristor 220 is connected to the reference voltage ($V_{ref}$).

Figure 7:
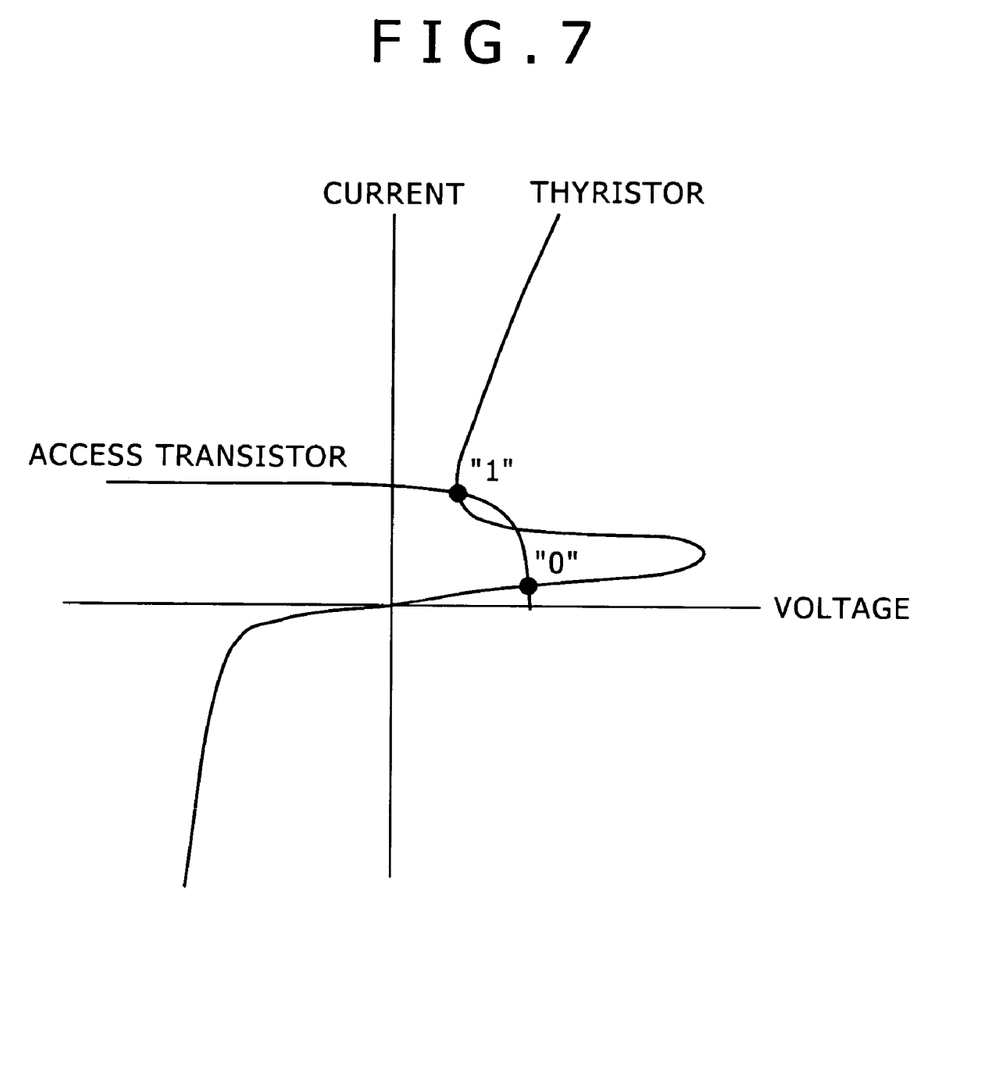
FIG. 7 is a current-voltage diagram showing the characteristics of the T-RAM memory cell in related art, which arise at the time of data holding.

The T-RAM memory cell holds data due to the characteristics shown in FIG. 7. When the voltage ($V_{ref}$) at the anode of the thyristor is kept high with respect to the bit line BL, "zero" is represented by the intersection of the high-resistance characteristic curve of the thyristor and the characteristic curve of the access transistor and "one" is represented by the intersection of the low-resistance characteristic curve of the thyristor and the characteristic curve of the access transistor.

Figure 8:
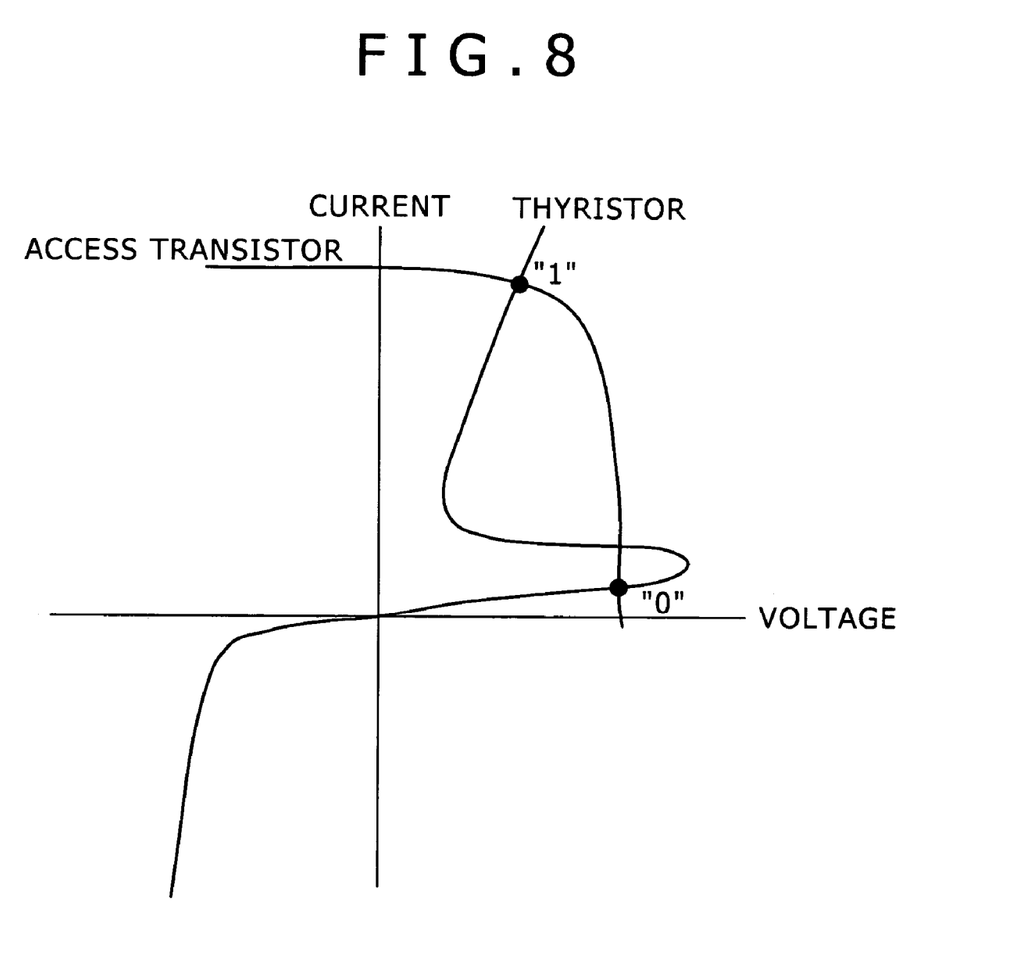
FIG. 8 is a current-voltage diagram showing the characteristics of the T-RAM memory cell in related art, which arise at the time of data reading.

The T-RAM memory cell permits data reading owing to the characteristics shown in FIG. 8. When a reading voltage is applied to the word line WL1 (so that the access transistor decreases in resistance) and the voltage ($V_{ref}$) at the anode of the thyristor is made high with respect to the bit line LB, "zero" is represented by current at the intersection of the high-resistance characteristic curve of the thyristor and the characteristic curve of the access transistor and "one" is represented by current at the intersection of the low-resistance characteristic curve of the thyristor and the characteristic curve of the access transistor.

Figure 9:
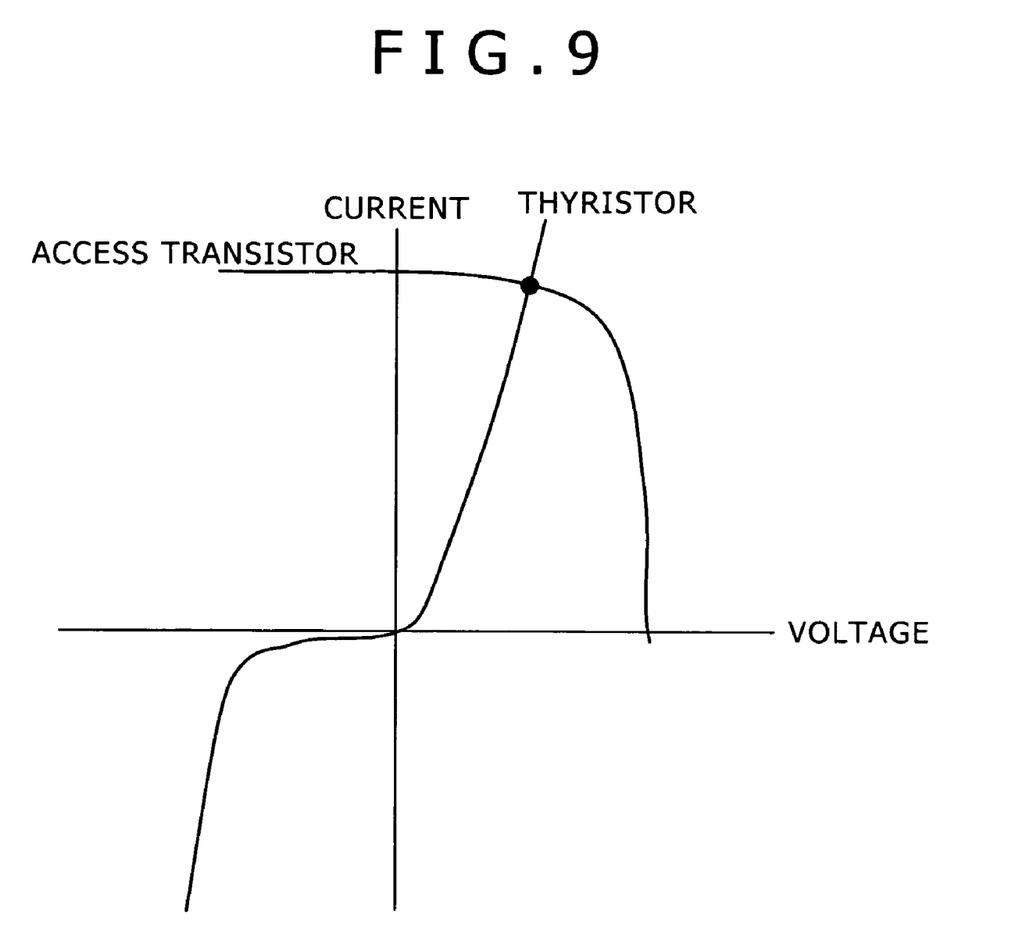
FIG. 9 is a current-voltage diagram showing the characteristics of the T-RAM memory cell in related art, which arise at the time of data writing for "one"

The T-RAM memory cell writes a data value of "one" by the characteristics shown in FIG. 9. This step is accomplished when a writing voltage is applied to the word lines WL1 and WL2 and the voltage of the bit line BL is made lower than the voltage ($V_{ref}$) at the anode of the thyristor so that the thyristor assumes the low-resistance state.

Figure 10:
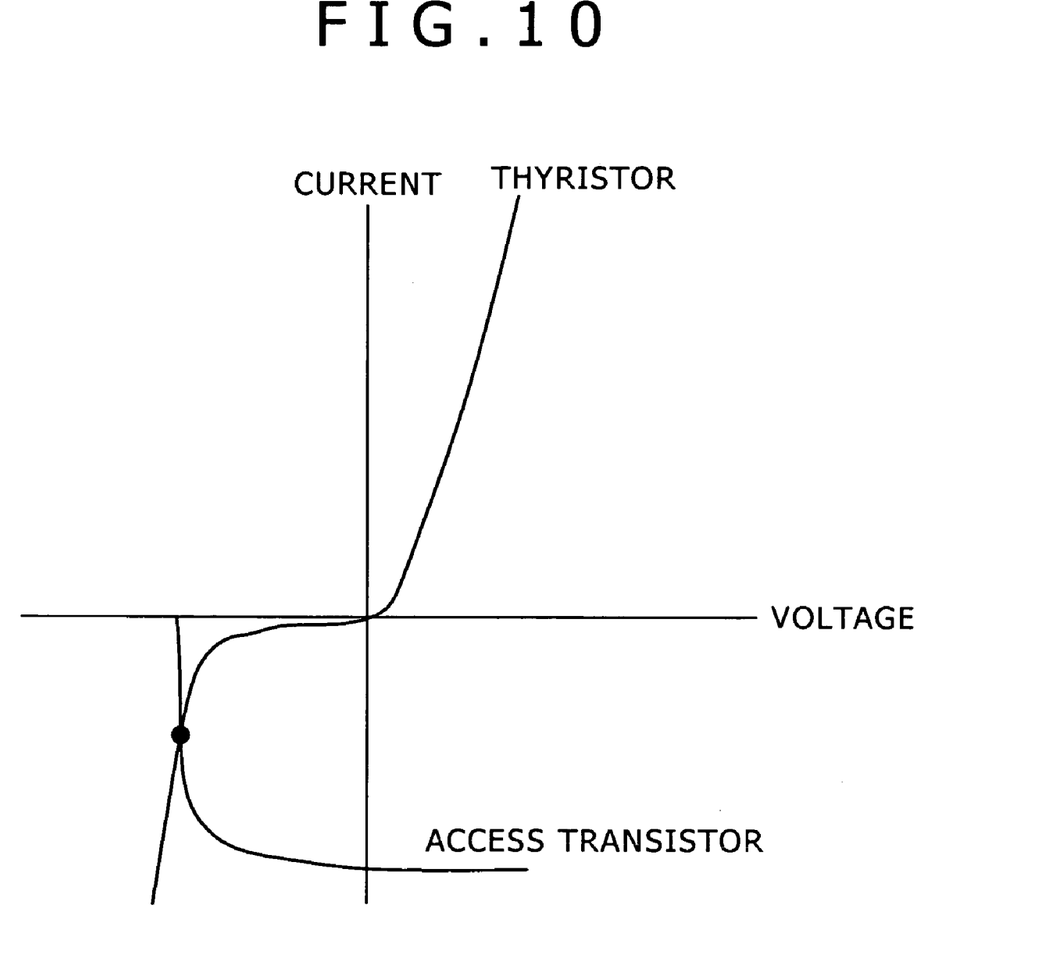
FIG. 10 is a current-voltage diagram showing the characteristics of the T-RAM memory cell in related art, which arise at the time of data writing for "zero".

The T-RAM memory cell writes a data value of "zero" by the characteristics shown in FIG. 10. This step is accomplished when a writing voltage is applied to the word lines WL1 and WL2 and the voltage of the bit line BL is made higher than the voltage ($V_{ref}$) at the anode of the thyristor so that the thyristor assumes the high-resistance state.

As mentioned above, the T-RAM memory cell composes one bit with one access transistor and one thyristor.

There has recently been proposed a technology for forming memory cells on an SOI substrate. (See Non-Patent Document 1.)

The thyristor-based memory cell structure mentioned above suffers the disadvantage of demanding a special process to realize the vertical thyristor. Also, the memory cell on an SIO substrate suffers the disadvantage of demanding an expensive SIO substrate and involving difficulties not encountered in ordinary bulk substrates.

The memory cell to be formed from a thyristor and an access transistor on a bulk substrate poses the following problem. The thyristor 120 is composed of a p type impurity layer (anode), an n type impurity layer (n type base), a p type impurity layer (p type base), and an n type impurity layer (cathode), which are formed vertically to give the p/n/p/n junction. When this thyristor is turned on and off, a vertical parasitic thyristor is formed by the p type impurity layer (anode), the n type impurity layer (n type base), the p type impurity layer (p type base), and an n type well in an n type impurity region formed under the p-type impurity layer (p type base). This vertical parasitic thyristor becomes on and off as the thyristor 120 is turned on and off, which causes holding current to flow through the deep n type well when a data value of "one" is held in the turn-on state.

The disadvantage of the memory cell formed on a bulk substrate is that the p-type base layer of thyristors has to be electrically divided for individual memory cells, which leads to a large element separating width (and hence a large cell size). This will be explained briefly below. The p-type base layer for thyristors has to be electrically separated for individual cells. A certain electrical distance is necessary between the p-type base layer and the p-type well of the access transistor. A certain width of element separation is necessary for possible disalignment and variation in line width of register pattern that would occur when implantation is performed to form the p-type base layer and the p-type well of the access transistor. This is the cause of the large element separating width and the large cell size.

SUMMARY OF THE INVENTION

The problem for solution by the present invention is that the above-mentioned memory cell in related art permits holding current to flow through the deeply formed n-type well when its thyristor is on to hold data. Another problem is that the memory cell in related art needs an electrical distance between the p-type base layer and the p-type well of the access transistor and also needs an allowance for process variation (which results in a large width for element separation).

There is a need for the present invention to provide a memory cell which is formed on an inexpensive bulk semiconductor but is yet free of any vertical parasitic thyristor. There is another need for the present invention to provide a small-sized memory cell with a reduced width for element separation.

The first embodiment of the present invention is directed to a semiconductor device which includes a bulk semiconductor substrate, an access transistor, a thyristor, an element separating region, and a wiring layer. The thyristor is formed on the bulk semiconductor substrate connecting to the access transistor. The element separating region separates the region for the access transistor and the region for the thyristor from each other. The wiring layer is connected to one of the diffused layers of the access transistor and the cathode of the thyristor together through a connecting hole, the impurity region at the anode side of the thyristor being composed of a p-type impurity region, an n-type impurity region, p-type impurity region, and an n-type impurity region, which are formed sequentially in the depthwise direction, with the lowermost n-type impurity region receiving the same voltage as that applied to the anode at the time of data holding.

The second embodiment of the present invention is directed to a semiconductor device which includes a bulk semiconductor substrate, an access transistor and a memory cell. The memory cell has a thyristor formed on the bulk semiconductor substrate connecting to the access transistor. The access transistor and the thyristor are formed in regions electrically separated from each other by an element separating region, a wiring layer connecting one of the diffused layers of the access transistor and the cathode of the thyristor together through a connecting hole. The bulk semiconductor substrate includes a p-type semiconductor substrate, the region for the thyristor formed with a p-type well shallower than the element separating region, an n-type well formed under the p-type well, the p-type well forming the region for the access transistor connected to the p-type semiconductor substrate.

The third embodiment of the present invention is directed to a semiconductor device which includes a bulk semiconductor substrate, an access transistor and a memory cell. The memory cell has a thyristor formed on the bulk semiconductor substrate connecting to the access transistor. The access transistor and the thyristor are formed in regions electrically separated from each other by an element separating region, a wiring layer connecting one of the diffused layers of the access transistor and the cathode of the thyristor together through a connecting hole. The bulk semiconductor substrate includes a p-type semiconductor substrate, the region for the thyristor formed with a p-type well, an n-type impurity region connected to the n-type well formed under the element separating region, the p-type well forming the region for the access transistor connected to the p-type semiconductor substrate.

The semiconductor device according to the first embodiment of the present invention is constructed such that the impurity region at the anode side of the thyristor is composed of the p-type impurity region, the n-type impurity region, the p-type impurity region, and the n-type impurity region which are sequentially formed in the depthwise direction. Therefore, the lowermost n-type impurity region receives the same voltage as applied to the anode at the time of data holding. This suppresses the vertical parasitic thyristor, while realizing a memory cell composed of an access transistor and a thyristor on a bulk semiconductor substrate. The memory cell structure according to the present invention and the voltage application at the time of data holding realize a small-sized memory cell. This in turn makes it possible to construct memory cells, each composed of the access transistor and the thyristor, on the inexpensive bulk semiconductor substrate which is in general use.

The semiconductor device according to the second embodiment of the present invention is included such that the bulk semiconductor substrate is a p-type semiconductor substrate, the region for the thyristor is formed with a p-type well shallower than the element separating region, the n-type well is formed under the p-type well, and the p-type well in which the access transistor is formed is connected to the p-type semiconductor substrate. Therefore, the region for the thyristor is completely separated electrically from the element separating region and the n-type well. This makes it possible to control the thyristor electrically independently. This in turn makes it possible to construct a memory cell from an access transistor and a thyristor on an inexpensive bulk semiconductor substrate which is in general use.

The semiconductor device according to the third embodiment of the present invention is included such that the bulk semiconductor substrate is a p-type semiconductor substrate, the region for the thyristor is formed with a p-type well, the n-type well is formed under the p-type well, the n-type impurity region (which is connected to the n-type well) is formed under the element separating region, and the p-type well in which the region for the access transistor is formed is connected to the p-type semiconductor substrate. Therefore, the region for the thyristor is completely separated electrically by the element separating region, the n-type well, and the n-type impurity region formed between them. This makes it possible to completely separate the elements of the thyristor and to control the thyristor electrically independently. This in turn makes it possible to construct a memory cell from an access transistor and a thyristor on an inexpensive bulk semiconductor substrate which is in general use.

DETAILED DESCRIPTION OF THE PREFERRED EMBODIMENTS

Figure 1:
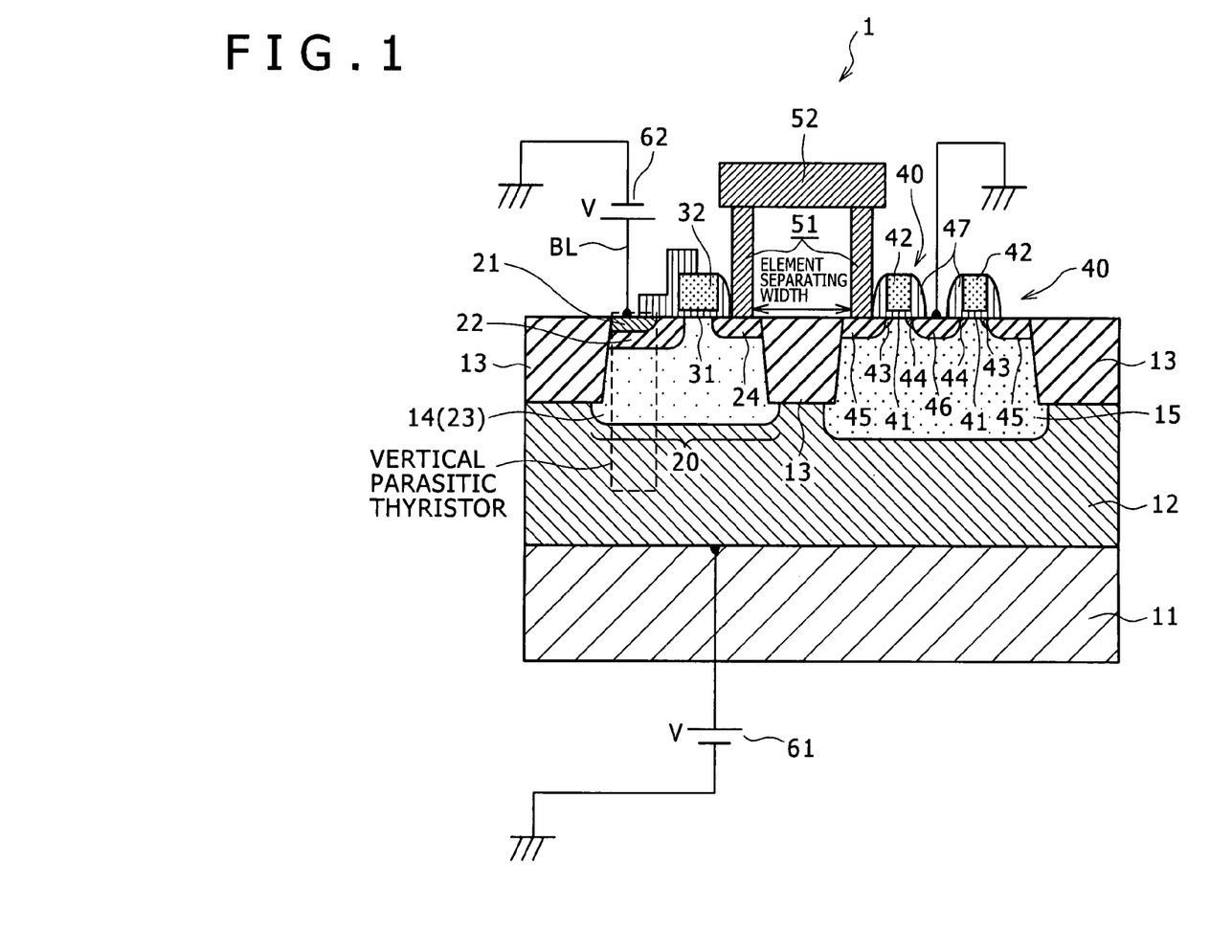
FIG. 1 is a schematic sectional view showing the first embodiment of the semiconductor device pertaining to the present invention.

The semiconductor device according to the first embodiment of the present invention will be described with reference to FIG. 1 which is a schematic sectional view.

The semiconductor device 1 shown in FIG. 1 has several layers arranged as follows. On the bulk semiconductor substrate 11 is formed the n-type well 12. On this n-type well 12 are formed the region for the access transistor and the region for the thyristor such that the two regions are separated from each other by the element separating region 13. The region for the thyristor is formed from the p-type well 14, and the region for the access transistor is formed from the p-type well 15.

In the p-type well 14 for the thyristor are formed the n-type impurity layer (n-type base region) 22 and the n-type impurity layer (n-type cathode region) 24, which are separated from each other. In the upper part of the n-type impurity layer 22 is formed the p-type impurity layer (p-type anode region) 21 which is separate from the p-type well 14. The other p-type impurity region (p-type base region) 23, which constitutes the thyristor 20, is formed from the p-type well 14. Thus, the thyristor 20 is composed of the p-type impurity layer 21, the n-type impurity layer 22, the p-type impurity layer 23, and the n-type impurity layer 24.

On the p-type impurity layer 23 of the thyristor is formed the gate electrode 32, with the gate insulating film 31 interposed between them. The gate electrode 32 is connected to the word line (not shown). The p-type impurity layer 21 (at the anode side of the thyristor 20) is connected independently to the bit line BL.

On the p-type well 15, in which the access transistor is to be made, is formed the gate electrode 42 (word line), with the gate insulating film 41 interposed between them. In the p-type well 15 (at one side of the gate electrode 42) is formed the source-drain region 45, with the extension region 43 interposed between them. Also, in the p-type well 15 (at the other side of the gate electrode 42) is formed the source-drain region 46, with the extension region 44 interposed between them. At both sides of the gate electrode 42 are formed the side walls 47 (which function as the spacer for the source-drain regions 45 and 45), with the extension regions 43 and 44 interposed between them. The access transistor 40 is constructed as mentioned above. Incidentally, one of the source-drain regions of the access transistor 40 may be common with one of the source-drain region of the access transistor of the adjoining memory cell, as shown in FIG. 1.

The n-type impurity layer 24 of the thyristor 20 is connected to one of the source-drain regions 45 of the access transistor 40 by the wiring layer 52 through the connecting hole 51.

The n-type well 12, which is the lowermost n-type impurity region, receives the same voltage as that applied to the anode at the time of data holding. Thus, the n-type well 12 is connected to the power supply 61 which applies the same voltage as that applied to the anode at the time of data holding. The p-type impurity layer 21 at the anode side of the thyristor 20 is connected to the power supply 62.

The semiconductor device 1 mentioned above has the thyristor 20 which is formed in the n-type well 12 at a low position. The thyristor 20 has the p-type impurity layer 23 which is electrically separated from the element separating region 13 for each cell. The n-type impurity region 24 of the thyristor 20 is electrically connected to the source-drain region 45 (which is the diffused layer of the access transistor 40) through the connecting hole 51 and the wiring layer 52.

The semiconductor device 1 according to the first embodiment of the present invention has the impurity region at the anode side of the thyristor. The impurity region is composed of the p-type impurity layer 21, the n-type impurity layer 22, the p-type impurity layer 23, and n-type well (as the n-type impurity region), which are formed downward sequentially. At the time of data holding, the lowermost n-type well 12 receives the same voltage as that applied to the p-type impurity layer 21 (as the anode). This keeps the p-type impurity layer 21 (as the anode) and the lowermost n-type well 12 at the same potential. The result is that the original thyristor 20 (which is composed of the p-type impurity layer 21, the n-type impurity layer 22, the p-type impurity layer 23, and the n-type impurity layer 24) does not turn on and off the vertical parasitic thyristor (which is composed of the p-type impurity layer 21, the n-type impurity layer 22, the p-type impurity layer 23, and the n-type well 12 of the n-type impurity region) when it becomes on and off. In other words, this prevents the occurrence of the vertical parasitic thyristor. Thus there is no possibility of holding current flowing into the n-type well (at the lowermost position) at the time of data holding, and this leads to improvement in data holding-performance. The memory cell structure according to an embodiment of the present invention permits the reduction of memory cell size. This in turn makes it possible to construct memory cells, each composed of the access transistor 40 and the thyristor 20, on the inexpensive bulk semiconductor substrate 11 which is in general use.

Figure 2:
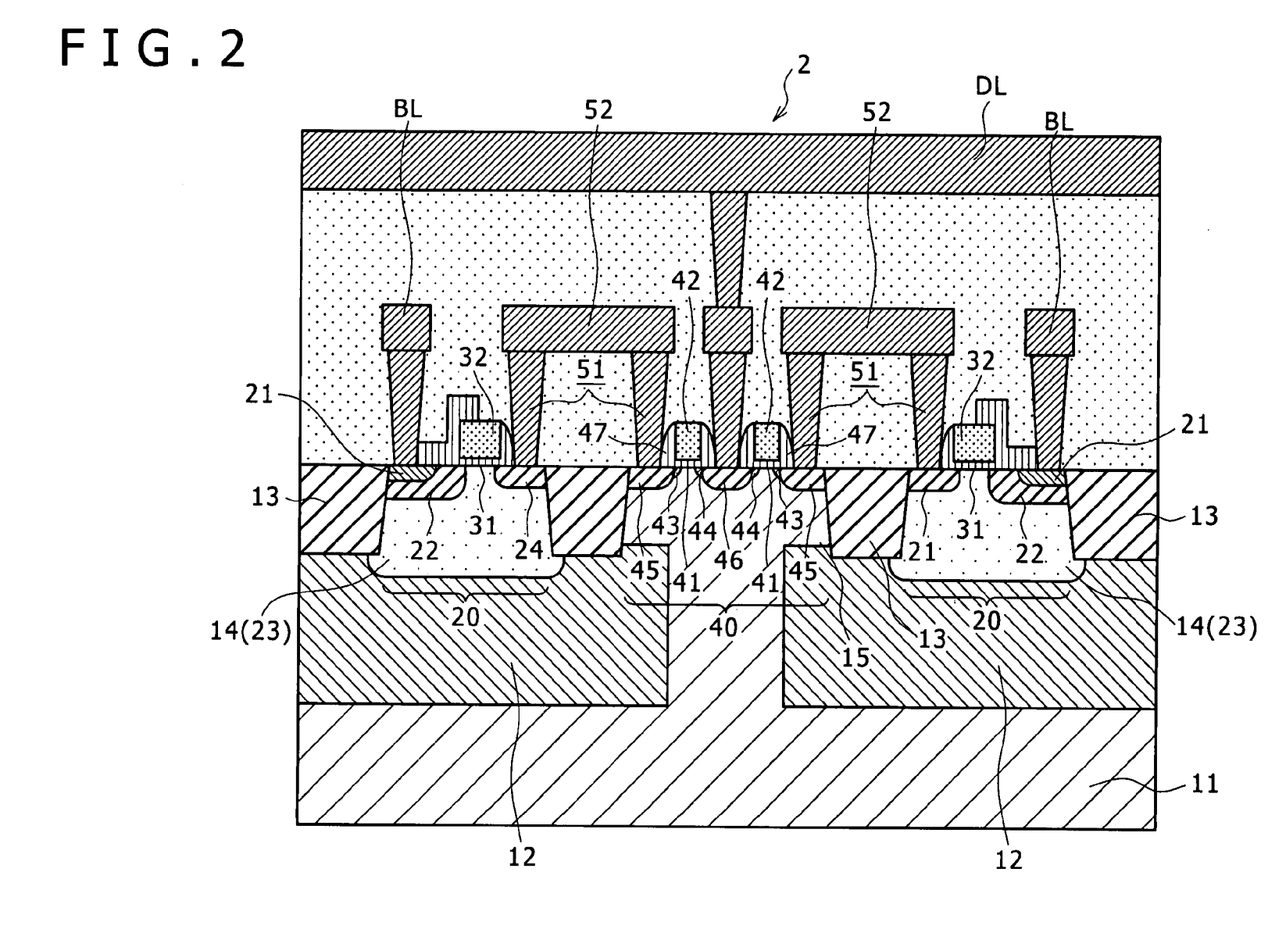
FIG. 2 is a schematic sectional view showing the second embodiment of the semiconductor device pertaining to the present invention.

The second embodiment of the semiconductor device pertaining to the present invention will be described with reference to FIG. 2 which is a schematic sectional view. FIG. 2 shows two memory cells in which one of the source-drain regions of the access transistor is formed in the common impurity region. The following description is concerned with only one of the two identical memory cells. The same constituents as in the first embodiment are denoted by the same symbols.

In FIG. 2, there is shown the bulk semiconductor substrate 11, on which lie the p-type well 14 (in which the thyristor is formed) and the p-type well 15 (in which the access transistor is formed), which are separated from each other by the element separating region 13 (which is deeper than the p-type well 15). The bulk semiconductor substrate 11 is a p-type silicon substrate. The element separating region 13 is formed by STI (Shallow Trench Isolation). Under the p-type well 14 is formed the n-type well 12, which is connected to the element separating region 13. Therefore, the p-type well 14 is completely isolated electrically from the region for the access transistor in the bulk semiconductor substrate 11 by the element separating region 13 and the n-type well 12. The p-type well 15 (in which the access transistor is formed) is connected to the bulk semiconductor substrate 11 (which is the p-type silicon substrate). Thus the p-type well 15 is grounded. This protects the p-type well 15 of the access transistor from floating and prevents any change that aggravates the current-voltage characteristics.

In the p-type well 14 of the thyristor are formed the n-type impurity layer (or n-type base region) 22 and the n-type impurity layer (or n-type cathode region) 24, which are separate from each other. In the upper part of the n-type impurity layer 22 is formed the p-type impurity layer (or p-type anode region) 21, which is separate from the p-type well 14. The other p-type impurity region (or p-type base region) 23, which constitutes the thyristor 20, is formed from the p-type well 14. Thus the thyristor 20 is composed of the p-type impurity layer 21, the n-type impurity layer 22, the p-type impurity layer 23, and the n-type impurity layer 24.

On the p-type impurity layer 23 of the thyristor is formed the gate electrode 32, with the gate insulating film 31 interposed between them. The gate electrode 32 is connected to the word line (not shown). The p-type impurity layer 21 (at the anode side of the thyristor 20) is connected independently to the bit line BL.

On the p type well 15, in which the access transistor is to be made, is formed the gate electrode 42 (word line), with the gate insulating film 41 interposed between them. In the p type well 15 (at one side of the gate electrode 42) is formed the source-drain region 45, with the extension region 43 interposed between them. Also, in the p type well 15 (at the other side of the gate electrode 42) is formed the source-drain region 46, with the extension region 44 interposed between them. At both sides of the gate electrode 42 are formed the side walls 47 (which function as the spacer for the source-drain regions 45 and 46), with the extension regions 43 and 44 interposed between them. The access transistor 40 is constructed as mentioned above.

The n-type impurity layer 24 of the thyristor 20 is connected to one of the source-drain regions 45 of the access transistor 40 by the wiring layer 52 through the connecting hole 51. The other source-drain region 46 of the access transistor 40 is connected to the data line DL as the second wiring layer.

The semiconductor device 2 according to the second embodiment of the present invention includes the p-type impurity layer 23 (or p-type well) 14 forming shallower than the element separating region 13. This permits the p-type well 14 of the thyristor and the p-type well 15 of the access transistor to be formed by self alignment by the element separating region 13. Self alignment obviates the necessity for allowance for the variation of resist pattern line width and the displacement of resist pattern that occur when the p-type well 14 of the thyristor and the p-type well 15 of the access transistor are formed. This reduces the width of the element separating region 13. The p-type well 15 of the access transistor will have a common potential for more than one bit when the p-type well 15 is electrically connected to the p-type bulk semiconductor substrate 11. This is accomplished by not forming the deep n-type well 12 in part of the p-type well 15 or by forming the p-type region (by additional implantation through a resist pattern) such that the lower part of the p-type well 15 is connected to the bulk semiconductor substrate 11.

The region for the thyristor 20 is completely separated electrically by the element separating region 13 and the n-type well 12 and hence the thyristor 20 can be independently controlled electrically. Because the bulk semiconductor substrate 11 is a p-type semiconductor substrate, the region of the thyristor is formed in the p-type well 14 shallower than the element separating region 13, the n-type well 12 is formed in the lower part of the p-type well 14, and the p-type well 15 for the access transistor is connected to the p-type semiconductor substrate. This in turn makes it possible to construct memory cells, each composed of the access transistor 40 and the thyristor 20, on the inexpensive bulk semiconductor substrate 11 which is in general use.

Figure 3:
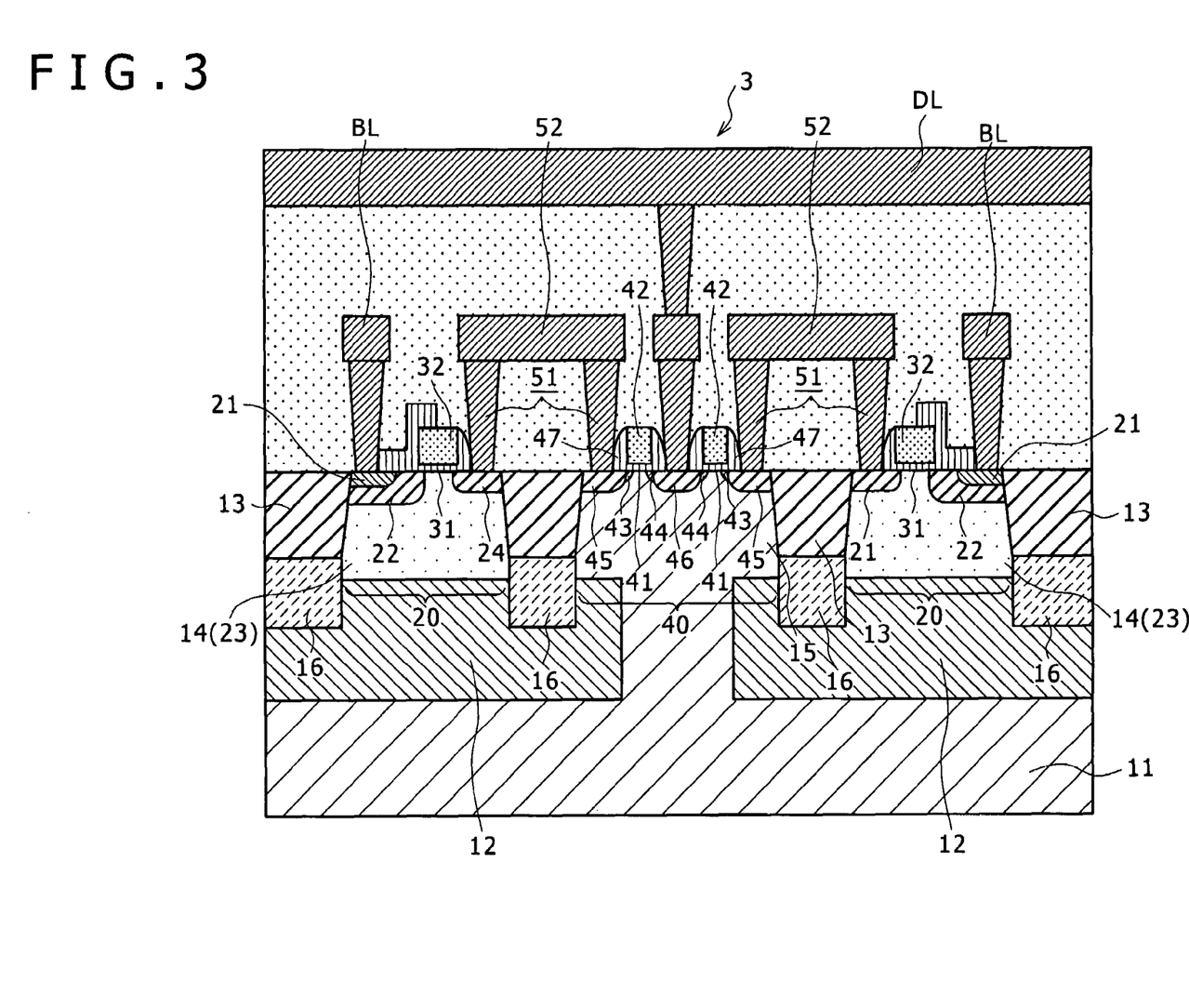
FIG. 3 is a schematic sectional view showing the third embodiment of the semiconductor device pertaining to the present invention.

The third embodiment of the semiconductor device pertaining to the present invention will be described with reference to FIG. 3 which is a schematic sectional view. FIG. 3 shows two memory cells in which one of the source-drain regions of the access transistor is formed in the common impurity region. The following description is concerned with only one of the two identical memory cells. The same constituents as in the first and second embodiments are denoted by the same symbols.

In FIG. 3, there is shown the bulk semiconductor substrate 11, on which lie the p-type well 14 (in which the thyristor is formed) and the p-type well 15 (in which the access transistor is formed), which are separated from each other by the element separating region 13 (which is deeper than the p-type well 15). The bulk semiconductor substrate 11 is a p-type silicon substrate. The element separating region 13 is formed by STI (Shallow Trench Isolation). Under the p-type well 14 is formed the n-type well 12. Under the element separating region 13 is formed the n-type impurity region 16, which is connected to the n-type well 12. Therefore, the n-type well 12 is connected to the element separating region 13 through the n-type impurity region 16. Thus, the p-type well 14 is completely isolated electrically from the region for the access transistor in the bulk semiconductor substrate 11 by the element separating region 13, n-type impurity region 16, and the n-type well 12.

The following method is employed to form the n type impurity region 16 under the element separating region 13. First, etching is performed on the bulk semiconductor substrate 11 to form the STI which becomes the element separating region 13, and then the STI is embedded. In advance of embedding, an n type impurity is implanted in the memory cell region so that the n type impurity region 16 is formed under the element separating region 13 by self alignment.

The p-type well 15 of the access transistor 40 is connected to the bulk semiconductor substrate 11 (which is a p-type silicon substrate) when it has a common potential for more than one bit. In this way the p-type well 15 is grounded. This protects the p-type well 15 of the access transistor from floating and prevents any change that aggravates the current-voltage characteristics.

In the p-type well 14 of the thyristor are formed the n-type impurity layer (or n-type base region) 22 and the n-type impurity layer (or n-type cathode region) 24, which are separate from each other. In the upper part of the n-type impurity layer 22 is formed the p-type impurity layer (or p-type anode region) 21, which is separate from the p-type well 14. The other p-type impurity region (or p-type base region) 23, which constitutes the thyristor 20, is formed from the p-type well 14. Thus the thyristor 20 is composed of the p-type impurity layer 21, the n-type impurity layer 22, the p-type impurity layer 23, and the n-type impurity layer 24.

On the p type well 15, in which the access transistor is to be made, is formed the gate electrode 42 (word line), with the gate insulating film 41 interposed between them. In the p type well 15 (at one side of the gate electrode 42) is formed the source-drain region 45, with the extension region 43 interposed between them. Also, in the p type well 15 (at the other side of the gate electrode 42) is formed the source-drain region 46, with the extension region 44 interposed between them. At both sides of the gate electrode 42 are formed the side walls 47 (which function as the spacer for the the source-drain regions 45 and 46),with the extension regions 43 and 44 interposed between them. The access transistor 40 is constructed as mentioned above.

On the p-type impurity layer 23 of the thyristor is formed the gate electrode 32, with the gate insulating film 31 interposed between them. The gate electrode 32 is connected to the word line (not shown). The p-type impurity layer 21 (at the anode side of the thyristor 20) is connected independently to the bit line BL.

On the p type well 15, in which the access transistor is to be made, is formed the gate electrode 42 (word line), with the gate insulating film 41 interposed between them. In the p type well 15 (at one side of the gate electrode 42) is formed the source-drain region 45, with the extension region 43 interposed between them. Also, in the p type well 15 (at the other side of the gate electrode 42) is formed the source-drain region 46, with the extension region 44 interposed between them. At both sides of the gate electrode 42 are formed the side walls 47 (which function as the spacer for the source-drain regions 45 and 46, with the extension regions 43 and 44 interposed between them. The access transistor 40 is constructed as mentioned above.

The n-type impurity layer 24 of the thyristor 20 is connected to one of the source-drain regions 45 of the access transistor 40 by the wiring layer 52 through the connecting hole 51.

The semiconductor device 3 according to the third embodiment of the present invention includes the region for the thyristor 20 being completely separated electrically by the element separating region 13, the n-type well 12, and the n-type impurity region 16 formed between them. This improve the element separation of the thyristor 20. The thyristor 20 can be controlled independently electrically. Because the bulk semiconductor substrate 11 is a p-type semiconductor substrate, the region of the thyristor is formed in the p-type well 14, the n-type well 12 is formed in the lower part of the p-type well 14, the n-type impurity region 16 (connected to the n-type well 12) is formed in the lower part of the element separating region 13, and the p-type well 15 to form the region of the access transistor is connected to the p-type semiconductor substrate (which is a bulk semiconductor substrate 11). This in turn makes it possible to construct memory cells, each composed of the access transistor 40 and the thyristor 20, on the inexpensive bulk semiconductor substrate 11 which is in general use. In addition, the above-mentioned structure makes it possible to form the p-type well 14 deep.

Figure 4:
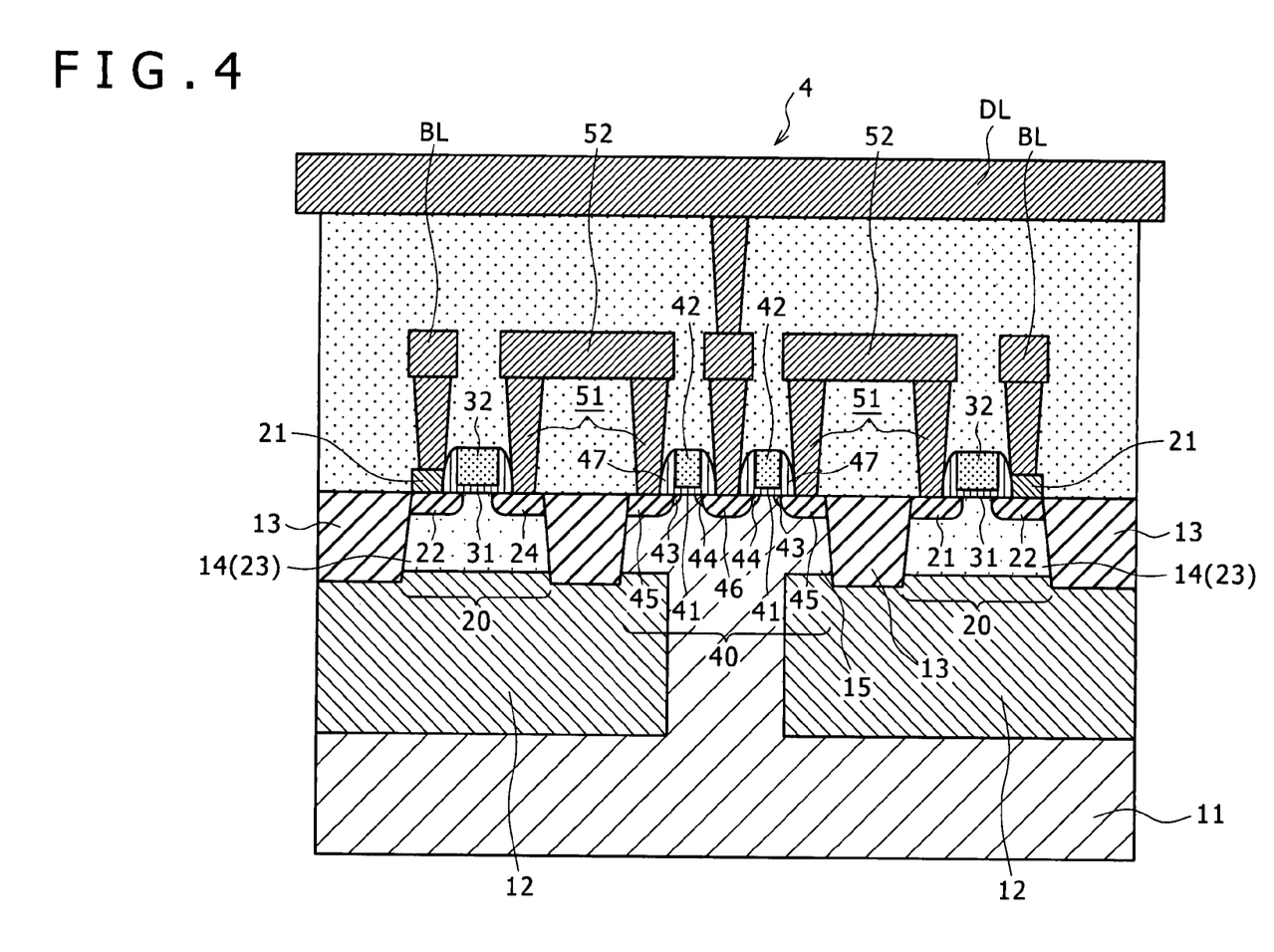
FIG. 4 is a schematic sectional view showing the fourth embodiment of the semiconductor device pertaining to the present invention.

The semiconductor device according to the fourth embodiment of the present invention will be described with reference to FIG. 4 which is a schematic sectional view. FIG. 4 shows two memory cells in which one of the source-drain regions of the access transistor is formed in the common impurity region. The following description is concerned with only one of the two identical memory cells. The other memory cell is constructed in the same way. The same constituents as in the first embodiment are denoted by the same symbols.

In FIG. 4, there is shown the bulk semiconductor substrate 11, on which lie the p-type well 14 (in which the thyristor is formed) and the p-type well 15 (in which the access transistor is formed), which are separated from each other by the element separating region 13 (which is deeper than the p-type well 15). The bulk semiconductor substrate 11 is a p-type silicon substrate. The element separating region 13 is formed by STI (Shallow Trench Isolation). Under the p-type well 14 is formed the n-type well 12, which is connected to the element separating region 13. Therefore, the p-type well 14 is completely isolated electrically from the region for the access transistor in the bulk semiconductor substrate 11 by the element separating region 13 and the n-type well 12. The p-type well 15 (in which the access transistor is formed) is connected to the bulk semiconductor substrate 11 (which is the p-type silicon substrate). Thus the p-type well 15 is grounded. This protects the p-type well 15 of the access transistor from floating and prevents any change that aggravates the current-voltage characteristics.

In the p-type well 14 of the thyristor are formed the n-type impurity layer (or n-type base region) 22 and the n-type impurity layer (or n-type cathode region) 24, which are separate from each other. In the upper part of the n-type impurity layer 22 is formed the p-type impurity layer (or p-type anode region) 21, which is separate from the p-type well 14. The other p-type impurity region (or p-type base region) 23, which constitutes the thyristor 20, is formed from the p-type well 14. Thus the thyristor 20 is composed of the p-type impurity layer 21, the n-type impurity layer 22, the p-type impurity layer 23, and the n-type impurity layer 24.

On the p-type impurity layer 23 of the thyristor is formed the gate electrode 32, with the gate insulating film 31 interposed between them. The gate electrode 32 is connected to the word line (not shown). The p-type impurity layer 21 (at the anode side of the thyristor 20) is connected independently to the bit line BL.

On the p type well 15, in which the access transistor is to be made, is formed the gate electrode 42 (word line), with the gate insulating film 41 interposed between them. In the p type well 15 (at one side of the gate electrode 42) is formed the source-drain region 45, with the extension region 43 interposed between them. Also, in the p type well 15 (at the other side of the gate electrode 42) is formed the source-drain region 46, with the extension region 44 interposed between them. At bothsides of the gate electrode 42 are formed the side walls 47 (which function as the spacer for thesource-drain regions 45 and 46), with the extension regions 43 and 44 interposed between them. The access transistor 40 is constructed as mentioned above.

The n-type impurity layer 24 of the thyristor 20 is connected to one of the source-drain regions 45 of the access transistor 40 by the wiring layer 52 through the connecting hole 51.

The semiconductor device 4 according to the fourth embodiment produces the same effect as the semiconductor device 2 according to the second embodiment. The cell size can be reduced because the p-type impurity layer 21 (at the anode side of the thyristor 20) is formed by epitaxial growth. This structure may also be applied to the semiconductor devices 1 and 3 described above with reference to FIGS. 1 and 3.

The above-mentioned semiconductor devices 1 to 4 according to the first to fourth embodiments may have a silicide of high-melting metal, such a cobalt (Co) and nickel (Ni), formed on the surfaces of the p-type impurity layer 21 (at the anode side of the thyristor 20), the n-type impurity layer 23 (as the base), the source-drain regions 45 and 46 of the access transistor 40, and the gate electrode 42.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a bulk semiconductor substrate;
   an access transistor;
   a thyristor formed on said bulk semiconductor substrate connecting to said access transistor;
   an element separating region that separates said access transistor and said thyristor from each other;
   a wiring layer connecting a diffused layer of said access transistor and a cathode of said thyristor through a connecting hole; and
   a first voltage source connected to an anode side of the thyristor;
   wherein the thyristor includes an impurity region on the anode side of said thyristor comprising a first p-type impurity region, a first n-type impurity region, a second p-type impurity region, and a second n-type impurity region, which are formed sequentially in the depthwise direction ;and the lowermost n-type impurity region being directly connected to a second voltage source that applies the same voltage as the first voltage source during data holding;

the anode of said thyristor being located at the first p-type impurity region formed on a top surface of the bulk semiconductor substrate at the anode side of the thyristor, and the cathode of said thyristor being formed on said top surface of the bulk semiconductor substrate.

2. The semiconductor device as set forth in claim 1, wherein the thruster further comprises a gate electrode positioned between the cathode and the anode side of the thruster, on the surface of the bulk substrate.

* * * * *